United States Patent
Trossen et al.

(10) Patent No.: US 7,940,557 B1
(45) Date of Patent: May 10, 2011

(54) NON-VOLATILE ELECTROMECHANICAL CONFIGURATION BIT ARRAY

(75) Inventors: David Richard Trossen, San Jose, CA (US); Malcolm John Wing, Palo Alto, CA (US)

(73) Assignee: Agate Logic, Inc., Cupertino, CA (US)

( * ) Notice: Subject to any disclaimer, the term of this patent is extended or adjusted under 35 U.S.C. 154(b) by 0 days.

(21) Appl. No.: 12/974,737

(22) Filed: Dec. 21, 2010

Related U.S. Application Data

(62) Division of application No. 11/285,535, filed on Nov. 22, 2005, now Pat. No. 7,885,103.

(51) Int. Cl.
*G11C 11/50* (2006.01)

(52) U.S. Cl. ........ 365/164; 365/166; 977/708; 977/943; 977/732

(58) Field of Classification Search .................. 365/164, 365/166; 977/708, 932, 943, 789, 742, 724, 977/732
See application file for complete search history.

(56) References Cited

U.S. PATENT DOCUMENTS

| | | | |
|---|---|---|---|
| 6,005,821 A | 12/1999 | Knaack et al. | |
| 6,531,891 B1 | 3/2003 | Sun et al. | |
| 6,574,130 B2 | 6/2003 | Segal et al. | |
| 6,625,047 B2 | 9/2003 | Coleman, Jr. | |
| 6,835,613 B2 | 12/2004 | Schlaf | |
| 7,479,654 B2 * | 1/2009 | Bertin et al. | 257/40 |
| 7,495,952 B2 | 2/2009 | Lai et al. | |
| 7,710,768 B2 | 5/2010 | Naito | |
| 2004/0240252 A1 | 12/2004 | Pinkerton et al. | |
| 2005/0036365 A1 * | 2/2005 | Bertin et al. | 365/163 |
| 2005/0041465 A1 * | 2/2005 | Rueckes et al. | 365/177 |
| 2005/0056866 A1 * | 3/2005 | Bertin et al. | 257/213 |
| 2005/0056877 A1 | 3/2005 | Rueckes et al. | |
| 2005/0062070 A1 | 3/2005 | Bertin et al. | |
| 2006/0092695 A1 | 5/2006 | Wing et al. | |
| 2008/0062744 A1 * | 3/2008 | Bertin et al. | 365/151 |
| 2009/0268503 A1 | 10/2009 | Schepens et al. | |
| 2009/0273971 A1 | 11/2009 | Schepens | |

OTHER PUBLICATIONS

Rueckes, "Carbon Nanotube-Based Nonvolatile Random Access Memory for Molecular Computing," Science, Jul. 7, 2000, vol. 289, pp. 94-97.

* cited by examiner

*Primary Examiner* — VanThu Nguyen
*Assistant Examiner* — Douglas King
(74) *Attorney, Agent, or Firm* — Radlo & Su LLP

(57) ABSTRACT

A configuration bit array including a hybrid electromechanical and semiconductor memory cell, and circuitry for addressing and controlling read, write, and erase accesses of the memory.

20 Claims, 14 Drawing Sheets

PRIOR ART

Fig. 3A — Switch Open

Fig. 3B — Switch Closed

| | WLA | WLB | BLA | BLB | Z |
|---|---|---|---|---|---|
| ERASE | GROUND | GROUND | RELEASE | RELEASE | VDD |
| WRITE ONE | PROGRAM | PROGRAM | PROGRAM | GROUND | VDD |
| WRITE ZERO | PROGRAM | PROGRAM | GROUND | PROGRAM | VDD |
| READ | VDD | GROUND | GROUND | GROUND | GROUND |

Fig. 7

|  | WLA | WLB | BL | Z |
| --- | --- | --- | --- | --- |
| ERASE | GROUND | GROUND | RELEASE | VDD |
| WRITE ONE | PROGRAM | GROUND | GROUND | VDD |
| WRITE ZERO | GROUND | PROGRAM | GROUND | VDD |
| READ | VDD | GROUND | GROUND | GROUND |

Fig. 9

| | WLA | WLB | BLA | BLB | Z |
|---|---|---|---|---|---|
| ERASE | GROUND | GROUND | RELEASE | RELEASE | VDD |
| WRITE ONE | PROGRAM | PROGRAM | GROUND | INHIBIT | VDD |
| WRITE ZERO | PROGRAM | PROGRAM | INHIBIT | GROUND | VDD |
| READ | VDD | GROUND | GROUND | GROUND | GROUND |

Fig. 12

| | WLA | WLB | BLA | BLB | Z |
|---|---|---|---|---|---|
| SET | PROGRAM | PROGRAM | GROUND | GROUND | VDD |
| WRITE ONE | GROUND | GROUND | GROUND | RELEASE | GROUND |
| WRITE ZERO | GROUND | GROUND | RELEASE | GROUND | GROUND |
| READ | VDD | GROUND | GROUND | GROUND | GROUND |

Fig. 14

NON-VOLATILE ELECTROMECHANICAL CONFIGURATION BIT ARRAY

CROSS REFERENCE TO RELATED APPLICATIONS

This application is a division of U.S. application Ser. No. 11/285,535 filed on 22 Nov. 2005, now U.S. Pat. No. 7,885,103 by inventors David Richard Trossen and Malcolm John Wing, entitled Non-Volatile Electromechanical Configuration Bit Array, the disclosure of which is expressly incorporated by reference herein in its entirety.

BACKGROUND OF THE INVENTION

1. Field of the Invention

This invention relates to hybrid electromechanical and semiconductor memory arrays and, in particular, to hybrid electromechanical and semiconductor configuration bit arrays often used in programmable logic devices.

2. History of the Prior Art

Memory structures are an essential building block for electronics devices and systems. There are a number of different types of memory structures which display differing characteristics making them suitable for different applications. One specialized application for memories is to program interconnections in a field programmable gate array (FPGA). A field programmable gate array is an integrated circuit that includes a two-dimensional array of general-purpose logic circuits whose functions are programmable. The logic circuits are linked to one another by programmable buses. Memory cells can be used to program the interconnect buses to select among a variety of different functions that the logic circuits are able to perform. A field programmable gate array is described in U.S. Pat. No. 6,531,891.

Prior art user programmable switches in a FPGA have been implemented in various technologies including static random access memory (SRAM) cells, flash electrically programmable read only memory (EPROM) cells, and electrically erasable programmable read only memory (EEPROM) cells. Memory cells that serve the purpose of configuring user programmable switches in a FPGA are referred to as "configuration bits."

Recently, the authors of "Carbon Nanotube-Based Nonvolatile Random Access Memory for Molecular Computing," Science, vol. 289, pp. 94-97, Jul. 7, 2000, proposed memory devices which use nanoscopic wires, such as single-walled carbon nanotubes, to form crossbar junctions which could serve as memory cells. The article describes individual single-walled nanotube wires suspended over other wires to define memory cells. In one condition, the wires do not touch and, thus, form an open circuit junction in a circuit adapted to transfer signals. However, electrical potentials may be furnished to the wires to cause them to physically attract one another and form a rectified junction. Each physical state (i.e., attracted or open) corresponds to an electrical state. When electric power is removed from the junction, the wires retain their physical (and thus electrical) state thereby forming a non-volatile memory cell. The carbon nanotube memory cell device described in the article is referred to hereinafter as an electromechanical device.

U.S. Pat. No. 6,574,130, entitled "Hybrid Circuit Having Nanotube Electromechanical Memory," Segal et al, furnishes additional details including modifications for manufacturability of such memory devices.

As the patent discloses, not only may a single carbon nanotube be utilized to construct such switches, but a layer of nanotube mesh, a layer of densely-packed carbon nanotubes, or some similar flexible conductive nanoscopic material may also be utilized. Furthermore, the patent teaches that it is possible to construct a hybrid electromechanical technology memory cell using semiconductor and carbon nanotube technology.

Carbon nanotube memory cell devices offer a number of advantages not provided by prior art memory cells. They are small, fast, and non-volatile. It is desirable to utilize carbon nanotube memory cell devices to provide the configuration bits in field programmable gate arrays.

SUMMARY OF THE INVENTION

The present invention is realized by a configuration bit memory cell including a pair of carbon nanoscopic switching devices, a common output point joining conductive paths through each of the carbon nanoscopic switching devices, first and second sources of potential of different values, circuitry connecting each of the first and second sources to a different one of the switching devices separated from the common output point by the conductive paths through each of the carbon nanoscopic switching devices, and control circuitry to complete the conductive path through one of the switching devices and open the conductive path through the other of the switching devices.

The present invention is realized by a configuration bit memory cell including a first carbon nanoscopic switching three-terminal device having a first terminal, a second terminal, and a third terminal, the first terminal connected to a first movable nanoscopic element, the second terminal connected to a release plate, a third terminal connected commonly to an attractor plate and an output node; a second carbon nanoscopic switching three-terminal device having a first terminal, a second terminal, and a third terminal, the first terminal connected to a second movable nanoscopic element, the second terminal connected to a release plate, a third terminal connected commonly to an attractor plate and the output node; a transistor having a first terminal, a second terminal, and a third terminal connected commonly to the third terminal of the first carbon nanoscopic switching device, the third terminal of the second carbon nanoscopic switching device, and the output node; and connection circuitry to complete a first conductive path through one of the carbon nanoscopic switching devices and opens a second conductive path through the other of the carbon nanoscopic switching devices, the connection circuitry including a first wordline extending in a first direction and connected to the first terminal of the first carbon nanoscopic switching device; a second wordline extending in a first direction and parallel to the first wordline, the second wordline connected to the first terminal of the second carbon nanoscopic switching device; a first bitline extending in a second direction, the first bit line connected to the second terminal of the first carbon nanoscopic switching device; a second bitline extending in a second direction and parallel to the first bitline, the second bitline connected to the second terminal of the second carbon nanoscopic switching device.

These and other objects and features of the invention will be better understood by reference to the detailed description which follows taken together with the drawings in which like elements are referred to by like designations throughout the several views. It is to be understood that, in some instances, various aspects of the invention may be shown exaggerated or enlarged to facilitate an understanding of the invention, and in other instances, some aspects of the invention considered to

BRIEF DESCRIPTION OF THE DRAWINGS

FIG. 5 illustrates an embodiment of a hybrid technology configuration bit cell in accordance with the present invention;

FIG. 7 is a summary table explaining erase, write, and set-for-read operations of the configuration bit cell shown in FIG. 5;

FIG. 9 is a summary table explaining erase, write, and set-for-read operations of the configuration bit cell shown in FIG. 8;

FIG. 12 is a summary table explaining erase, write, and set-for-read operations of the configuration bit cell shown in FIG. 11;

FIG. 14 is a summary table explaining alternative erase, write, and set-for-read operations of the configuration bit cell of FIGS. 11 and 13.

DETAILED DESCRIPTION

Figure 1:
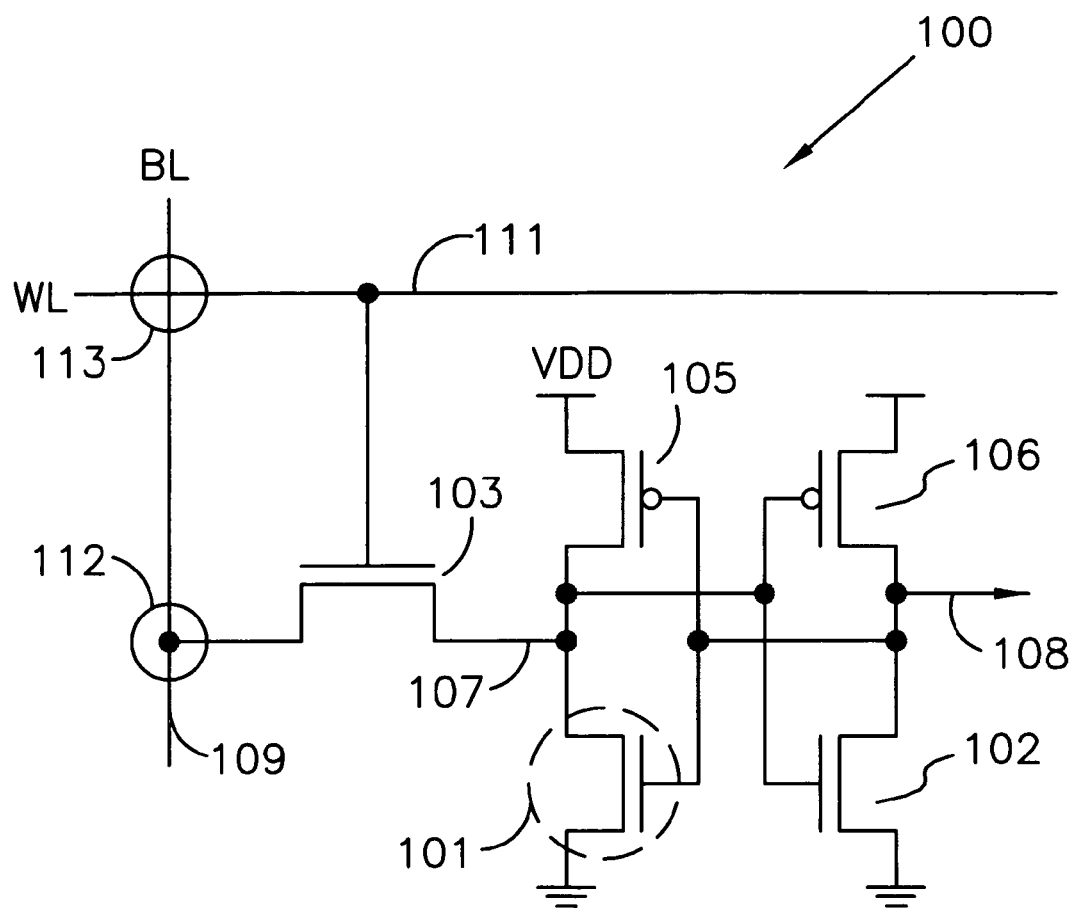
FIG. 1 is a schematic diagram illustrating the internal memory cell structure of a prior art semiconductor technology configuration bit.

FIG. 1 is a schematic diagram of a prior art five transistor SRAM memory cell 100 which utilizes semiconductor technology and will be useful in enabling one skilled in the art to understand the present invention. In the figure, a crossing such as that at node 113 (circled for emphasis) indicates that there is no electrical connection between two conductors 111 and 109, whereas the dot at the crossing at node 112 (circled for emphasis) indicates an electrical connection between two conductors.

The cell 100 includes both storage circuitry and access circuitry. N type metal oxide semiconductor (NMOS) device 101 and P type metal oxide semiconductor (PMOS) device 105 are connected together and to supply terminals as a first inverter gate device. Specifically, the gate terminals of the two metal oxide semiconductor devices are tied together at node 108, and the drain terminals are tied together at node 107. The source terminal of the PMOS device 105 is connected to a positive supply (e.g., VDD), and the source terminal of the NMOS device 101 is connected to a negative supply (e.g., GROUND). The shared gate node 108 may be viewed as the input node of the first inverter, and the shared drain node 107 may be viewed as the output node of the first inverter. Similarly, NMOS device 102 and PMOS device 106 are connected to form a second inverter gate device receiving input at node 107 and furnishing output at node 108.

The input of the first inverter is connected to the output of the second inverter, and the output of the first inverter is connected to the input of the second inverter thus forming a feedback latch structure. This latch structure provides the storage circuitry component of the memory cell 100.

Access to the storage circuitry component of the memory cell 100 is provided by an NMOS device 103 and associated conductors. The NMOS device 103 connects the output node 107 of the first inverter (and the input node of the second inverter) to a bit line 109 (BL). More specifically, the source and drain terminals of device 103 connect bit line 109 to the output of the first inverter; and the gate terminal of device 103 connects to a word line 111 (WL).

The SRAM storage circuitry is capable of storing a value until a new value is presented but loses any stored value if power is removed. To illustrate, presume that a high or positive value of voltage on a node indicates a logic level of "ONE," and a low or negative value of voltage on a node indicates a logic level "ZERO." If a voltage level ONE (VDD) is presented to the node 107 while a voltage level ZERO (GROUND) is presented simultaneously to the node 108, and then those levels are removed, the storage cell 100 assumes a condition which may be considered to represent a logic state of ONE. Since the input of the first inverter is at logic level ZERO, the device 105 is enabled driving its output to logic level ONE; similarly, the second inverter drives its output to logic level ZERO. The feedback provided by the latching arrangement assures that after the initial voltages presented to the storage circuitry are removed, the storage circuitry continues to store the logic state ONE. If, on the other hand, a logic level ZERO is presented to the node 107 and a logic level ONE is simultaneously presented to the node 108 and these levels are subsequently removed, the storage cell maintains a logic state ZERO.

The access circuitry allows the storage circuitry to be written. Writing the storage cell occurs when bit line 109 is presented with a logic level (ONE or ZERO) and the word line node 111 is presented with an enabling voltage level VDD. Since the bit line driver (not shown) and NMOS device 103 are designed to be much stronger than either NMOS device 101 or PMOS device 105, the voltage level on bit line 109 is forced on node 107. This in turn forces the opposite voltage level on node 108 (due to the inverter), and the initial condition of opposite simultaneous voltage (logic) levels on nodes 107 and 108 is obtained. Thus, to write a logic state of ONE into the storage circuitry, the bit line 109 is presented with a voltage level VDD while the word line 111 is presented with a voltage level VDD. On the other hand, to write a logic state of ZERO into the storage circuitry, the bit line 109 is presented with a voltage level GROUND while the word line 111 is furnished a voltage level VDD.

The five transistor SRAM cell 100 is an example of a prior art arrangement which may serve as a configuration bit. The five transistor SRAM cell illustrated in FIG. 1 is different than a conventional six transistor SRAM memory cell in the manner in which the cell is read. In a six transistor SRAM cell, there is another MOS device similar to the device 103 connected to the node 108; the extra device is used in the reading process and helps select one of several possible SRAM cells in the column of the array the contents of which will be selected for output. In the five transistor SRAM cell used as a configuration bit, the wire 108 is a dedicated output wire that is connected at all times to some destination circuitry. In the figure, the node 108 explicitly terminates with an arrow. This convention is used to indicate that this is an output port which is connected to circuitry outside of the memory cell 100.

Figure 2:
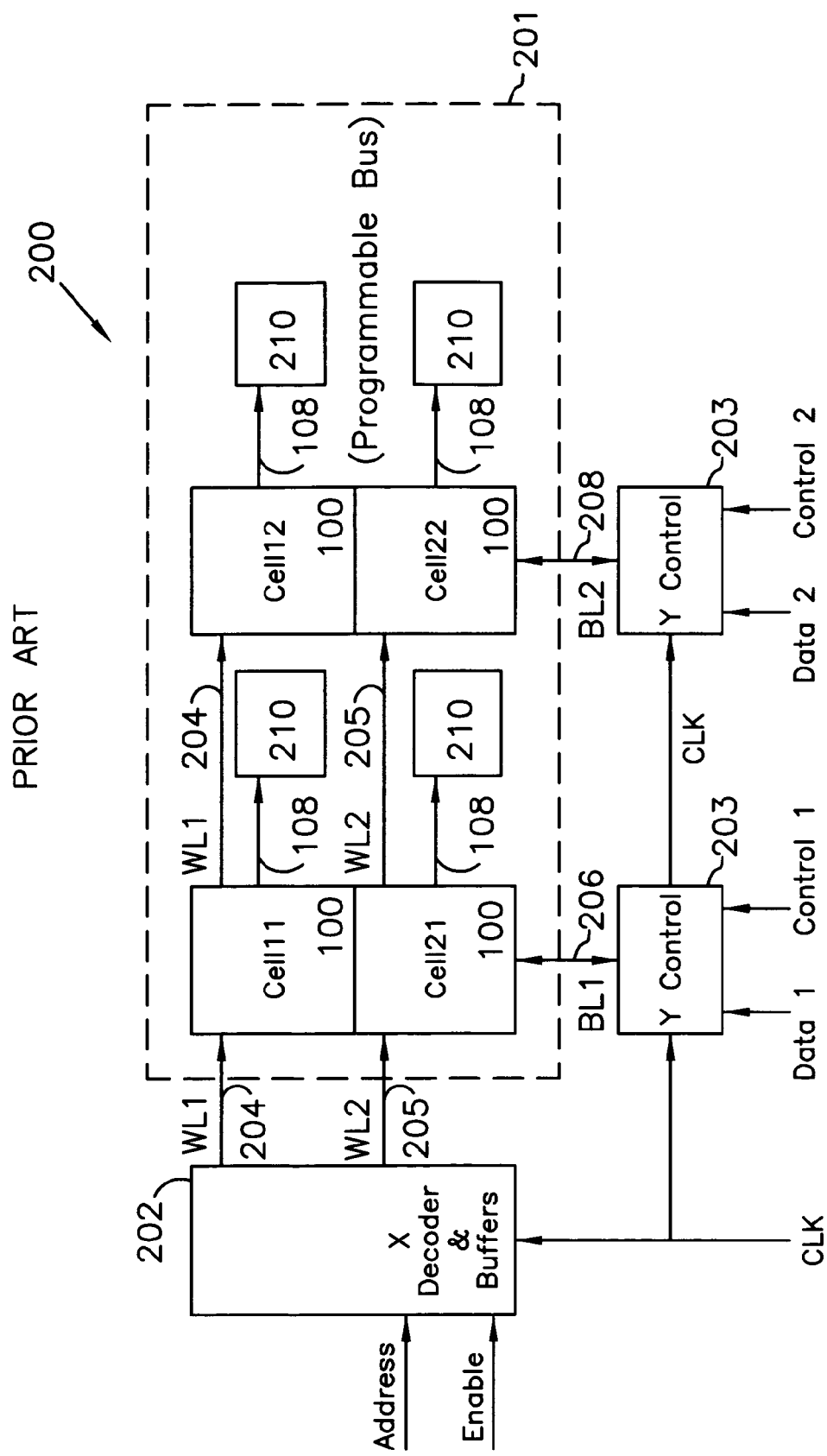
FIG. 2 is a block diagram illustrating an embodiment of a prior art semiconductor technology configuration bit array as used in an FPGA.

FIG. 2 is a block diagram illustrating a SRAM configuration bit block array 200. The exemplary array 200 is a four cell structure 201. Each of the cells CELL11, CELL12, CELL21, CELL22 may be a five transistor SRAM memory cell such as the cell 100 shown in FIG. 1. Each cell has an output node 108 which presents the control signal for a programmable bus 210. Besides the programmable interconnect blocks, there may be other circuitry such as logic blocks between the two configuration bit columns that is not shown for diagram simplicity.

Input addresses for the write operation are furnished to a X decoder and buffers block 202. The decoder 202 receives the address, clock (CLK), and enable signals and provides output on shared word lines 204 (WL1) and 205 (WL2). The word line 204 selects CELL11 and CELL12, while the word line 205 selects CELL21 and CELL22. Y control blocks 203 receive the input data, control, and clock (CLK) signals. The Y control blocks 203 furnish output to shared bit lines 206 (BL1) and 208 (BL2). The bit line 206 is shared by CELL11 and CELL21, while the bit line 208 is shared by CELL12 and CELL22. The memory cells are written as described above by selecting the appropriate word line while driving the appropriate bit line with the desired write logic value. To prevent the writing of other cells in the same row as the selected cell, the bit lines for these other rows are not driven to either logic level ONE or logic level ZERO but are left floating. The memory cells are read at the dedicated hard wires 108 that control the programmable buses 210.

FIGS. 3A and 3B are idealized representations of a carbon nanotube based electromechanical memory storage device or switch 300 in two different conditions. FIG. 4 is a symbolic representation of the same device 300 which is used in schematic circuits hereinafter. In FIG. 3A, a carbon nanotube based layer 303 is shown suspended between two conductive posts 301. The posts 301 make electrical contact with the layer 303 at all times. Below the suspended layer 303 is an attractor plate 302. Above the layer 303 is a rigid oxide spacer 305, and above the spacer 305 is a release plate 304. In FIG. 3A, a gap 306 exists so that there is no electrical contact between the layer 303 and the attractor plate 302. In this condition, the storage device (switch) 300 is considered open, a state which may be said to represent a logic state ONE. However, the layer 303 may be moved to eliminate the gap 306 and touch the attractor plate 302 making electrical contact therebetween (as shown at position 307 in FIG. 3B). In this position, the switch 300 is considered closed, a condition which may be said to represent a logic state ZERO.

In order to move the layer 303 and close the switch 300, a potential difference or voltage is applied between the terminal 301 and the attractor plate 302 (and thus between the layer 303 and the plate 302). The applied voltage generates electrostatic field lines that attract the suspended layer 303 towards the attractor plate 302 so that the two eventually make electrical contact. Even after the voltage and corresponding electrostatic field cease to exist, the layer 303 will continue indefinitely to make contact with the attractor plate 302 due to atomic attraction forces (van der Waals forces). This condition may thus be utilized to furnish a nonvolatile representation of the memory state ZERO. The voltage difference necessary to close the switch 300 is hereinafter referred to as PROGRAM.

The carbon nanotube device 300 has the interesting property that the magnitude of the applied voltage level needs only to be greater than PROGRAM in order to program the switch, and it does not matter whether or not the voltage difference of level PROGRAM between plate 302 and layer 303 is positive or negative. U.S. Pat. No. 6,574,130 referred to above describes the regions of operation of a carbon nanotube device such as the device 300 discussed above. The present invention, however, adds another mode of operation for conditionally closing such a switch. If the voltage difference between the release plate 304 and the layer 303 is greater than a threshold voltage difference called INHIBIT, it will prevent the switch 300 from closing even though the voltage difference between plate 302 and layer 303 is equal to or somewhat greater than PROGRAM. Once again, this effect is only magnitude dependent and does not depend on whether the voltage difference is negative or positive. Hence it is more accurate to say that an open carbon nanotube switch will close if the voltage magnitude between plate 302 and layer 303 is greater than PROGRAM and the voltage magnitude between plate 304 and layer 303 is less than INHIBIT.

In order to open the switch 300 and reproduce the gap 306, a potential difference or voltage is applied between the layer 303 and the release plate 304. The applied voltage generates field lines that attract the layer 303 back toward the release plate 304 to the suspended position illustrated in FIG. 3A. The layer 303 will continue to remain suspended indefinitely in the position in which a gap 306 exists between the layer 303 and the attractor plate 302 even after the voltage and corresponding field cease to exist. This state may thus be utilized to furnish a nonvolatile representation of a logic state ONE. The voltage difference between the plate 304 and layer 303 necessary to open the switch 300 is hereinafter referred to as RELEASE. This critical voltage is also sign independent and depends only on potential difference.

It should be noted that the voltage values of PROGRAM and RELEASE are larger than INHIBIT, VDD, and GROUND in order to prevent undesired opening or closing of switches. Moreover, in the following explanation voltage levels are often said to be at level PROGRAM, INHIBIT, or RELEASE despite the fact that these terms were defined as voltage differences and not voltage values. This terminology is used because the voltage levels are discussed in reference to a zero voltage level (GROUND) and hence are intrinsically differences.

The switch circuit schematic illustrated in FIG. 4 is a conceptual representation of the device 300 shown in FIGS. 3A and 3B and is not intended to indicate either switch open or closed states. The symbol is provided to facilitate the description of circuitry utilizing the device 300. It should be noted for such description that the attractor plate 302 is labeled SN, the release plate 304 is labeled RN, and the input terminal at post 301 is labeled IN.

FIG. 5 is a schematic diagram of a new configuration bit cell 500 which utilizes two electromechanical carbon nanotube devices 502 and 503 and a NMOS semiconductor device 501. The configuration bit cell 500 serves the same function as the cell 100 illustrated in FIG. 1 but has the added benefit of being nonvolatile. The hybrid technology configuration bit cell 500 uses the two switches 502 and 503 to store one bit of state as will be described. The cell state is erased and written by controlling the voltage levels on the wordline A (504), wordline B (505), bitline A (506), bitline B (507), and conductor Z (508). The cell is read at a dedicated read node 509. The process of initializing or modifying the state of the configuration bit cell is a threefold process involving erasing, writing, and setting for read.

The configuration bit memory cell 500 includes the first carbon nanoscopic switching three-terminal device 502 having a first terminal, a second terminal, and a third terminal, wherein the first terminal connected to a first movable nanoscopic element 303*a*, the second terminal connected to a release plate 304*a*, a third terminal connected commonly to the attractor plate 302*a* and the output node 509. The configuration bit memory cell 500 further includes a second carbon nanoscopic switching three-terminal device 503 having a first terminal, a second terminal, and a third terminal, wherein the first terminal connected to a second movable nanoscopic element 303*b*, the second terminal connected to a release plate 304*b*, a third terminal connected commonly to an attractor plate 302*b* and the output node. The transistor 501 has a first terminal, a second terminal, and a third terminal connected commonly to the third terminal of the first carbon nanoscopic switching device 502, the third terminal of the second carbon nanoscopic switching device 503, and the output node 509. Connection circuitry completes a first conductive path through one of the carbon nanoscopic switching devices and opens a second conductive path through the other of the carbon nanoscopic switching devices. The connection circuitry includes the first wordline 504 extending in a first direction and connected to the first terminal of the first carbon nanoscopic switching device 502, the second wordline 505 extending in a first direction and parallel to the first wordline such that the second wordline is connected to the first terminal of the second carbon nanoscopic switching device 502. The first bitline 506 extends in a second direction such that the first bit line 506 is connected to the second terminal of the first carbon nanoscopic switching device 503. The second bitline 507 extends in a second direction and parallel to the first bitline 506. The second bitline 507 is connected to the second terminal of the second carbon nanoscopic switching device 503.

Figure 3:
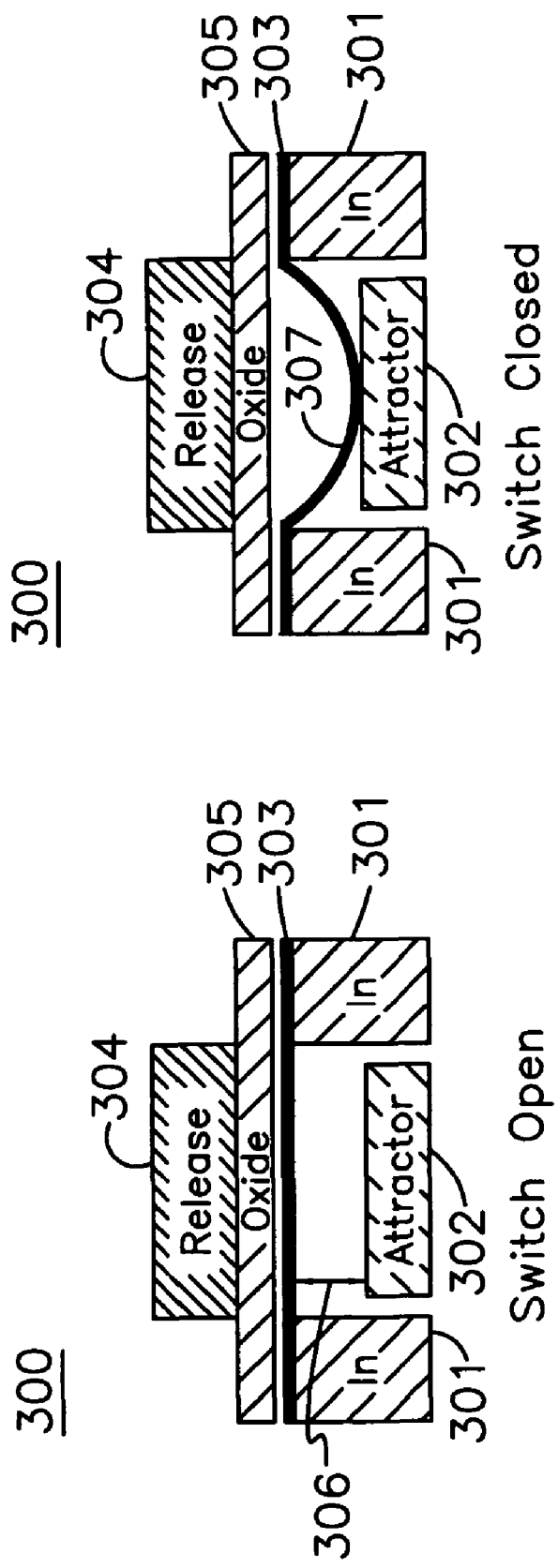
FIG. 3A is a diagram illustrating an embodiment of an electromechanical device which may be utilized in the present invention and is shown in a switch-open condition.
FIG. 3B is a diagram illustrating an embodiment of an electromechanical device which may be utilized in the present invention and is shown in a first switch-closed condition.
Figure 4:
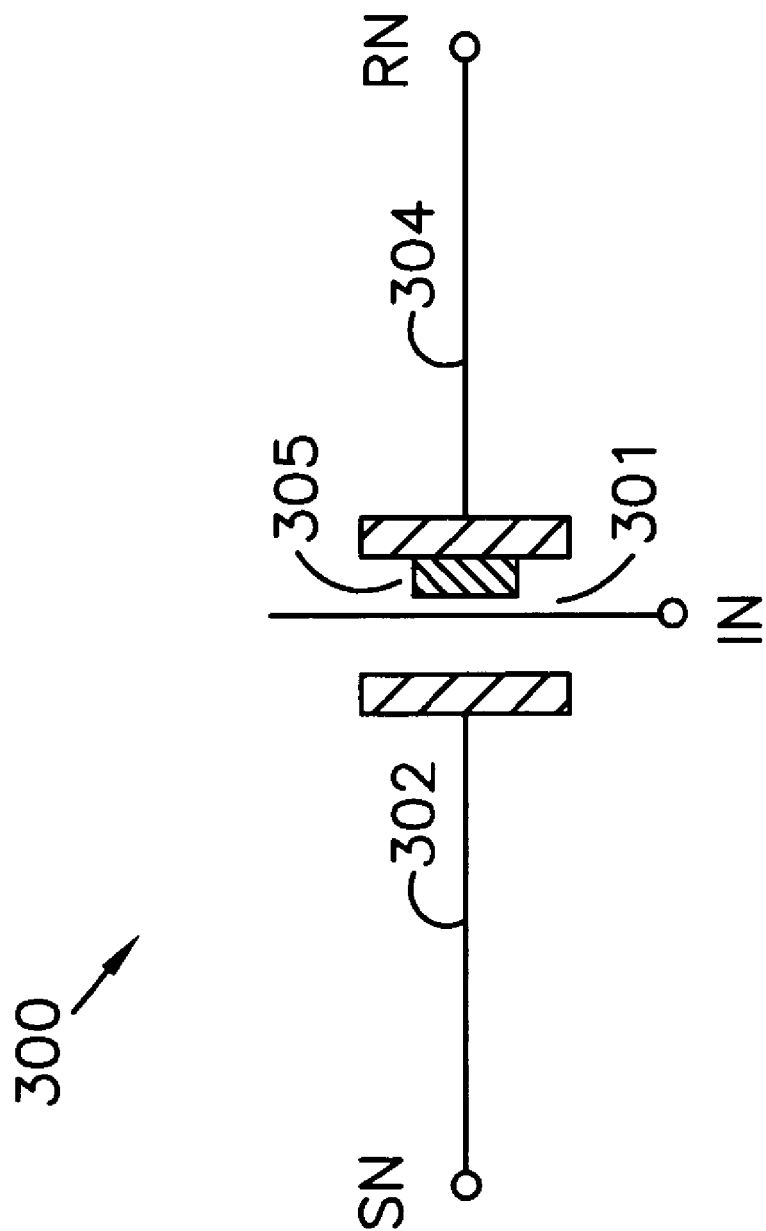
FIG. 4 is a schematic representation utilized in illustrating the embodiments of the electromechanical device illustrated in FIGS. 3A and 3B.

The first erasing phase of modifying the contents of configuration bit cell 500 places both of the carbon nanotube switches 502 and 503 into the open states (shown in FIG. 3A). This is accomplished by setting wordlines 504 and 505 to voltage level GROUND, bitlines 506 and 507 to voltage level RELEASE, and conductor 508 to voltage level VDD. Setting conductor 508 to voltage level VDD causes the NMOS device 501 to turn on and soon drives the read node 509 to voltage level GROUND. At this point, both switches 502 and 503 have the following terminal voltage levels: attractor plate 302 is at GROUND, terminal 301 is at GROUND, and release plate 304 is at RELEASE. As outlined with regard to FIG. 3, this set of terminal voltages resets the devices into the open state as shown in FIG. 3A. Hence, both carbon nanotube switches 502 and 503 are open and any state stored in the cell 500 is erased.

In the second setting phase of modifying the configuration bit cell contents, exactly one of either switch 502 or switch 503 in set to the closed state shown in FIG. 3B. During this phase, the wordlines 504 and 505 are set to voltage level PROGRAM; and the conductor 508 is set to voltage level VDD. The voltage levels of bitlines 506 and 507 can be at either of two pairs of values depending on which one of the switches 502 or 503 is programmed to the closed state.

In order to write a logic state of ZERO in the cell, the bitline 506 is set to voltage level GROUND and the bitline 507 is set to voltage level PROGRAM; while the wordlines 504 and 505 and the conductor 508 are set as mentioned above. The voltage level VDD on the conductor 508 causes the NMOS device 501 to turn on and bring the read node 509 to voltage level GROUND. At this point, the switch 502 has its attractor plate at GROUND, its nanotube layer at PROGRAM, and its release node at GROUND. The switch 503, on the other hand, has its attractor plate at GROUND, its nanotube layer at PROGRAM, and its release node at PROGRAM. The terminal voltages for device 502 are thus in the inhibit category mentioned earlier; and, therefore, the device does not change state but remains open. The terminal voltages for the device 503, however, are in the set category; and, therefore, the switch enters the closed state shown in FIG. 3B.

In order to write the state of ONE in the cell, the bitline 506 is set at voltage level PROGRAM while the bitline 507 is set at voltage level GROUND. Thus, the device 502 has its attractor plate at GROUND, its nanotube layer at PROGRAM, and its release node at PROGRAM. The device 503, on the other hand, has its attractor plate at GROUND, its nanotube layer at PROGRAM, and its release node at GROUND. The terminal voltages for device 502 are in the set category, and therefore the switch enters the closed state shown in FIG. 3B. The terminal voltages for device 503 are in the inhibit category, and therefore the switch does not change state but remains open.

The third phase of modifying the configuration bit cell contents, the setting for read phase, sets the configuration bit cell in a mode in which the output at the read node 509 is the same as the state stored by the cell. This is accomplished by setting the wordline 504 to voltage level VDD, the wordline 505 to voltage level GROUND, the bitline 506 to voltage level GROUND, the bitline 507 to voltage level GROUND, and the conductor 508 to voltage level GROUND. Since the conductor 508 is set to voltage level GROUND, the NMOS device 501 is in a high impedance state and does not conduct. Since exactly one of switches 502 and 503 is closed, the dedicated read node 509 is forced to either the voltage level VDD of wordline 504 or to the voltage level GROUND of wordline 505 depending on which of the two switches 502 and 503 is closed and conducting. Hence, the state of the configuration bit cell is determined by which of the two switches is in the closed state. If the switch 502 is closed, then the read node 509 is at voltage level VDD due to the conduction path to wordline 504; and the configuration bit cell stores logic state ONE. If, on the other hand, the switch 503 is closed, then the read node 509 is at voltage level GROUND due to the conduction path to wordline 505; and the configuration bit cell stores the logic state ZERO. The configuration bit cell will remain in the read setting until a new configuration bit state is written by this same three step process. The three step process for this cell is summarized in FIG. 7. It should be noted that the cell either goes through the write ONE phase or the write ZERO phase illustrated but not both.

Figure 6:
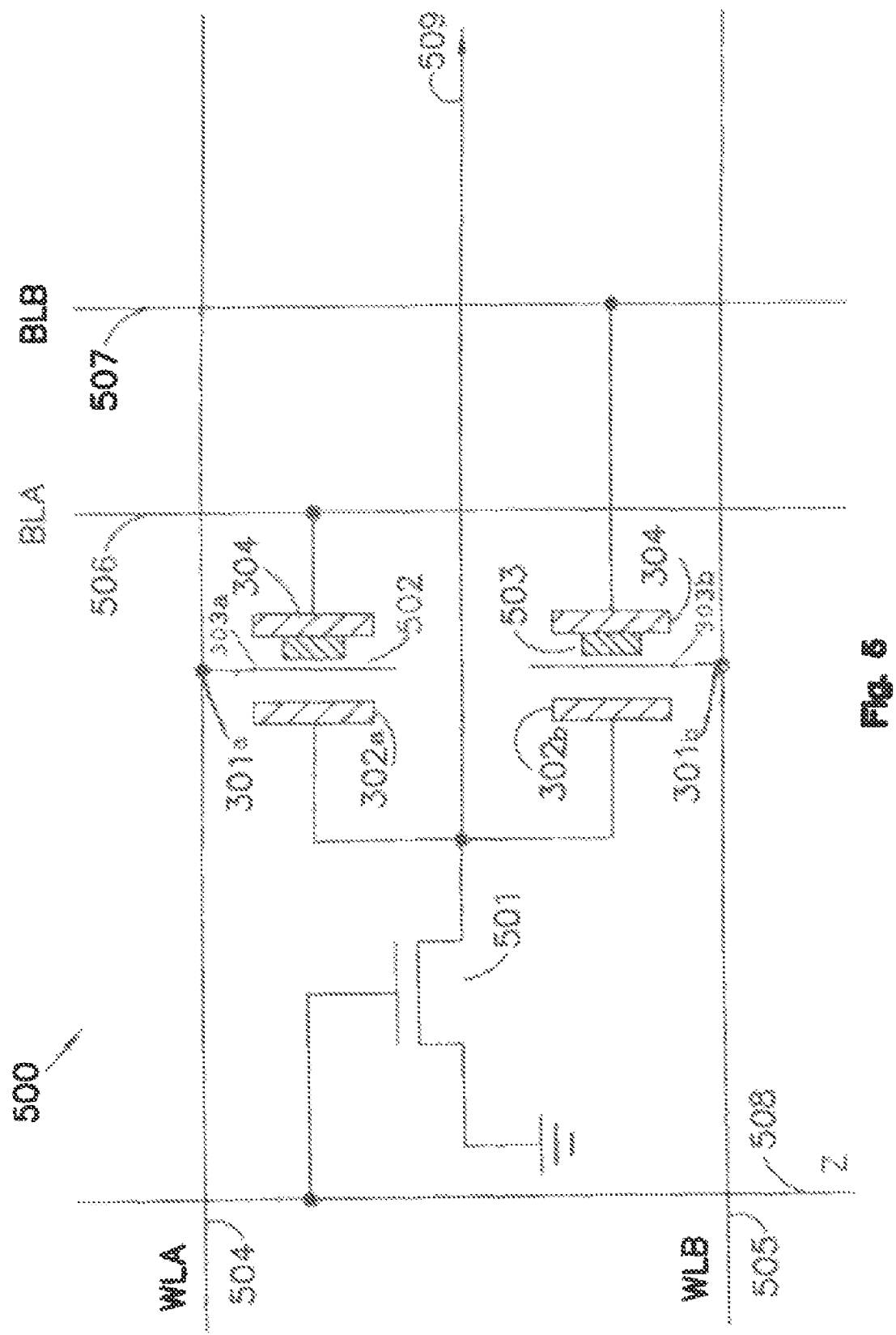
FIG. 6 illustrates an embodiment of a hybrid technology configuration bit array using the configuration bit cell of FIG. 5.
Figure 6:
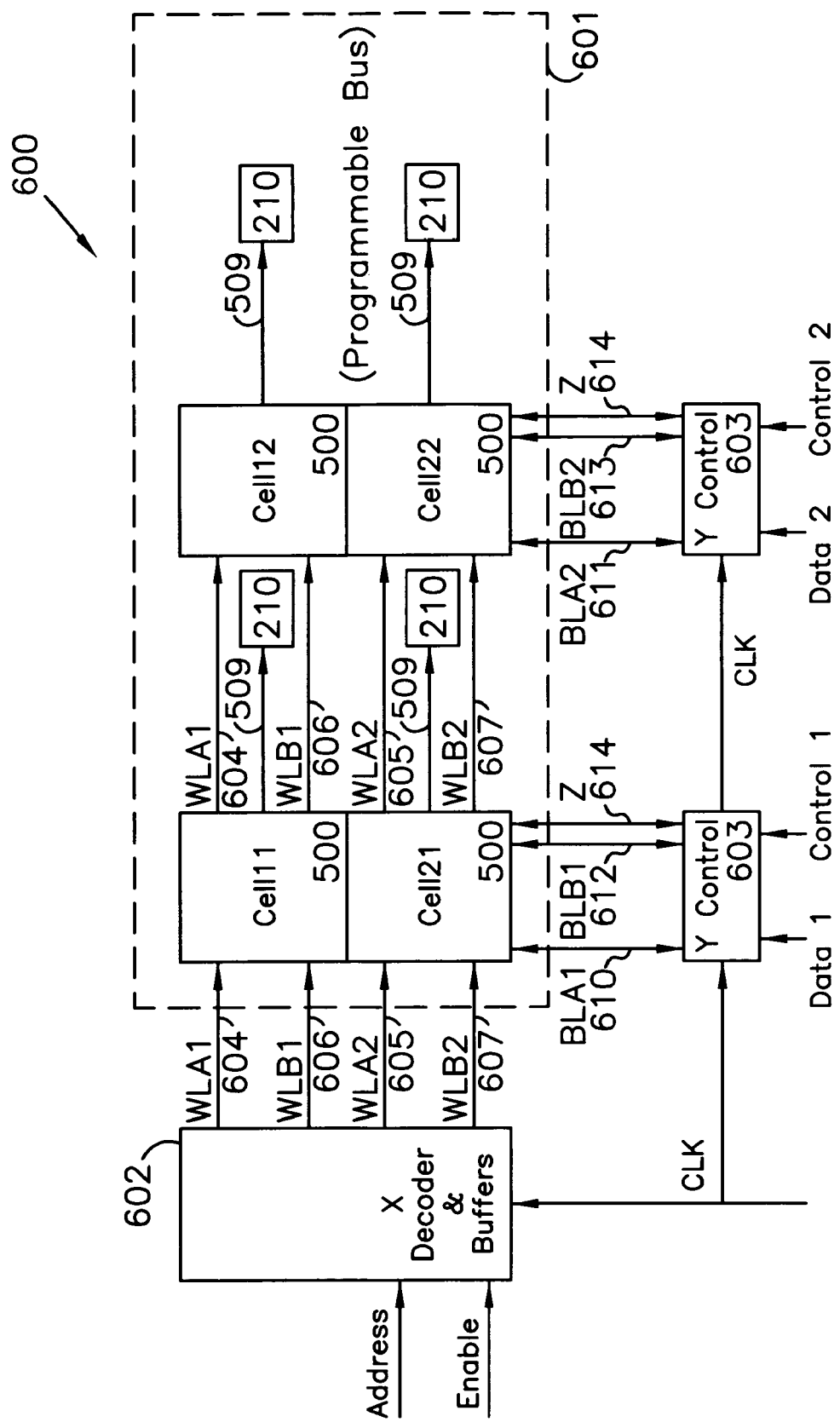

FIG. 6 is a block diagram illustrating an array 600 of configuration bit cells. The array 600 includes a four cell structure 601. Each of the cells CELL11, CELL12, CELL21, and CELL22 is a hybrid electromechanical configuration bit cell such as the cell 500 shown in FIG. 5. Each cell has a read output node 509 which furnishes a control signal for a programmable bus 210. Besides the programmable interconnect blocks, there may be other circuitry not part of the array (such as logic blocks between the two configuration bit columns) that is not shown for diagram simplicity. Input addresses for the write and erase operations are furnished to decoder and buffers 602. The decoder 602 receives the address, clock (CLK), and enable signals and provides output on shared word lines 604 (WLA1), 605 (WLA2), 606 (WLB1), and 607

(WLB2). The word lines 604 and 606 select CELL11 and CELL12, while the word lines 605 and 607 select CELL21 and CELL22. Y control blocks 603 receive input data, control, and clock (CLK) signals. The blocks 603 furnish output to shared bit lines 610 (BLA1), 611 (BLA2), 612 (BLB1), and 613 (BLB2). The bit lines 610 and 612 are shared by CELL11 and CELL21, while the bit lines 611 and 613 are shared by CELL12 and CELL22.

Memory cell writes are accomplished in a manner similar to that described earlier.

The same three phase configuration bit cell programming is done at the array level. First, all configuration bit cells are erased by bringing all word lines 604, 605, 606, and 607 to voltage level GROUND, the global Z conductor 614 to voltage level VDD, and all bit lines 610, 611, 612, and 613 to voltage level RELEASE. The erase procedure is identical to that described earlier for the cell level. Next, the entire array is written row by row in the write phase. This is accomplished by driving the word lines associated with the row being written to voltage level PROGRAM, driving the word lines of all other rows to voltage level INHIBIT, driving global Z conductor 614 to voltage level VDD, and driving the bit lines in accordance with the values to be written. For example, to write Cell 11 to ZERO, Cell 12 to ONE, Cell 21 to ZERO, and Cell 22 to ZERO (after first erasing the memory in the manner described), the first row cells Cell 11 and Cell 12 are written to state values ZERO and ONE, respectively. To do this, the Z conductor 614 is driven to VDD, word line 604 to PROGRAM, word line 606 to PROGRAM, word line 605 to INHIBIT, word line WLB2 to INHIBIT, bit line 610 to GROUND, bit line 612 to PROGRAM, bit line 611 to PROGRAM, and bit line 613 to GROUND. In a manner identical to that discussed regarding the cell, the top row is written by selecting the row using the word lines 604 and 606 and by using the various bit lines 610, 611, 612, and 613 to control the cell state to determine which of the two switches in each configuration bit cell is set to the closed state.

Next, the second row cells Cell 21 and Cell 22 are written to state values ZERO and ZERO, respectively. To do this, Z conductor 614 is driven to VDD, word line 604 to INHIBIT, word line 606 to INHIBIT, word line 605 to PROGRAM, word line 607 to PROGRAM, bit line 610 to GROUND, bit line 612 to PROGRAM, bit line 611 to GROUND, and bit line 613 to PROGRAM. As before, the word lines 605 and 607 are used to select the appropriate row to be written, and the bit lines 610, 611, 612, and 613 are used to control the values written to this selected row.

As will be understood, the word lines of the non-selected rows are driven to INHIBIT when writing the second row (containing cells Cell 21 and Cell 22), in order not to accidentally erase the state of the first row (containing cells Cell 11 and Cell 12) while driving large voltage values approximately the same as RELEASE on the shared bit lines 610, 611, 612, and 613. By driving the word lines of the unselected row to INHIBIT, these devices are placed in inhibit mode which retains the state that was previously written to them.

Finally, after writing the entire memory array row by row so that the configuration bit cells are in the desired logic states, the word lines are set appropriately for read. The Z conductor 614 is driven to GROUND, bit line 610 to GROUND, bit line 612 to GROUND, bit line 611 to GROUND, bit line 613 to GROUND, word line 604 to VDD, word line 606 to GROUND, word line 605 to VDD, and word line 607 to GROUND. As was described at the cell level, each cell drives its stored state onto the dedicated read lines to be used by the programmable buses.

Figure 8:
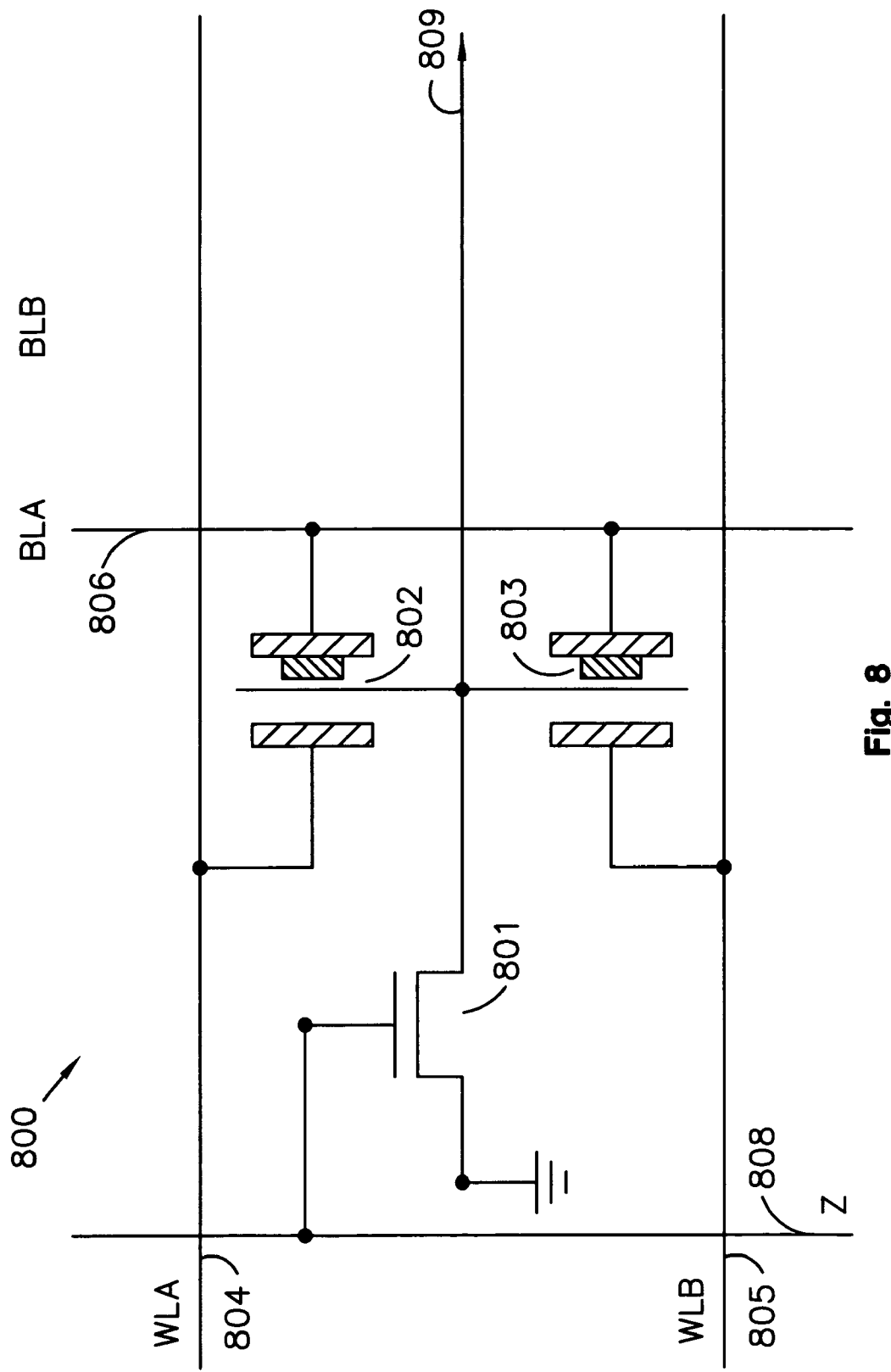
FIG. 8 illustrates an alternate embodiment of a hybrid technology configuration bit cell in accordance with the present invention.

FIG. 8 illustrates a schematic diagram of an alternate configuration bit cell 800 which also uses two electromechanical devices and a NMOS device. The cell 800 serves the same function as the cell 500 shown in FIG. 5 and also uses a similar threefold process (i.e., erase, write, and set for read) to initialize or modify the contents of a configuration bit cell. The details of the values applied for the process are summarized by FIG. 9, and the process is self-apparent from those details.

The configuration bit memory cell 800 includes a first carbon nanoscopic switching three-terminal device 802 having a first terminal, a second terminal, and a third terminal, where the first terminal is connected to an attractor plate, the second terminal is connected to a release plate, and a third terminal is connected commonly to a first movable nanoscopic element and an output node. The configuration bit memory cell 800 further includes a second carbon nanoscopic switching three-terminal device 803 having a first terminal, a second terminal, and a third terminal, where the first terminal is connected to an attractor plate, the second terminal is connected to a release plate, and a third terminal is connected commonly to a second movable nanoscopic element and the output node. A transistor 801 has a first terminal, a second terminal, and a third terminal is connected commonly to the first movable nanoscopic element of the first carbon nanoscopic switching device 802, the second movable nanoscopic element of the second carbon nanoscopic switching device 803, the third terminal of the first carbon nanoscopic switching device 802, the third terminal of the second carbon nanoscopic switching device 803, and the output node 809. Connection circuitry completes a first conductive path through one of the carbon nanoscopic switching devices and opens a second conductive path through the other of the carbon nanoscopic switching devices. The connection circuitry includes a first wordline 804 extending in a first direction and is connected to the first terminal of the first carbon nanoscopic switching device 802. A second wordline extends in a first direction and parallel to the first wordline in which the second wordline is connected to the first terminal of the second carbon nanoscopic switching device 803. A first bitline 806 extends in a second direction such that the first bit line 806 is connected to both the second terminal of the first carbon nanoscopic switching device 802 and the second terminal of the second carbon nanoscopic switching device 803.

Figure 10:
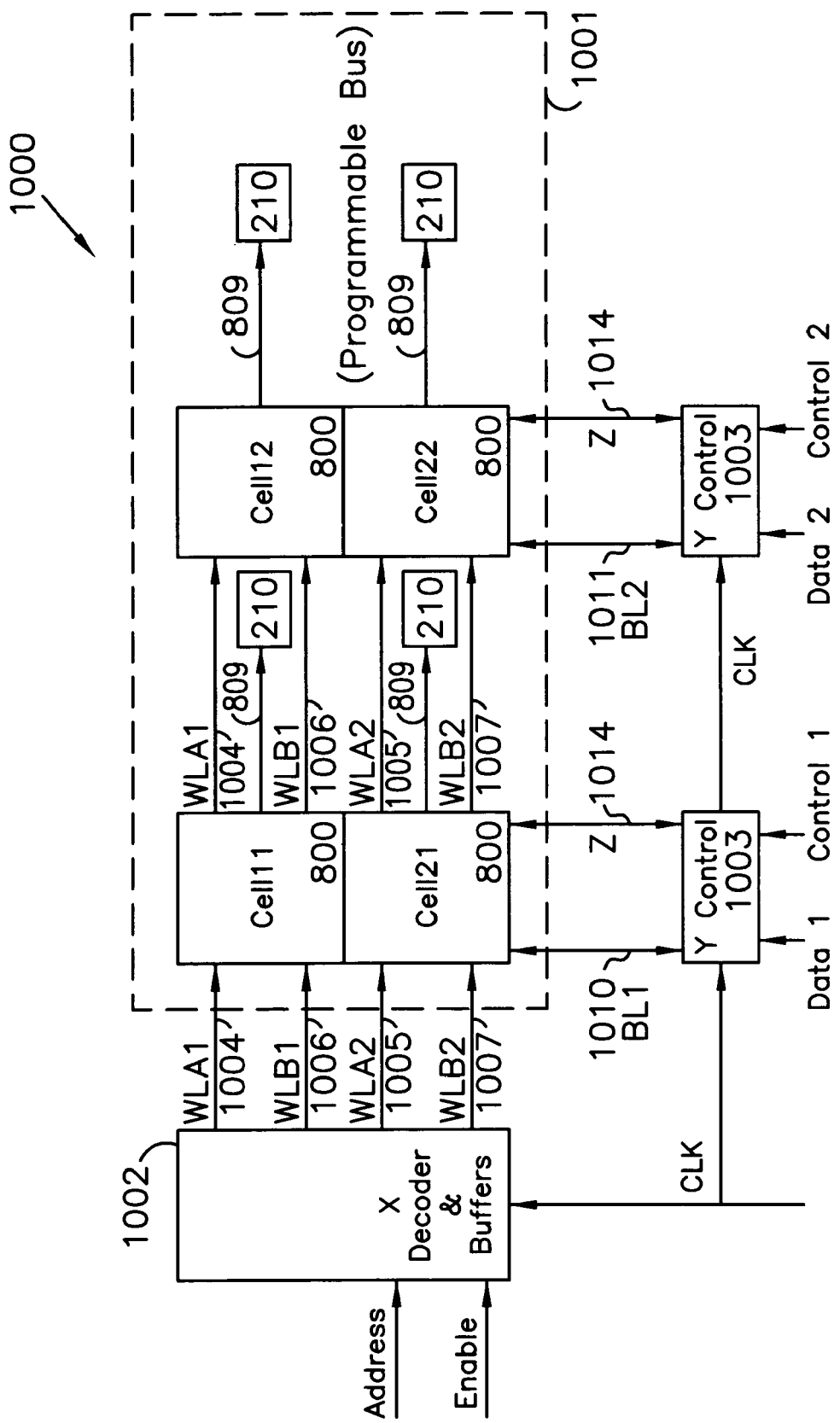
FIG. 10 illustrates an embodiment of a hybrid technology configuration bit array using the configuration bit cell of FIG. 8.

FIG. 10 is a block diagram illustrating an array 1000 of configuration bit cells. The array 1000 includes a four cell structure 1001. Each of the cells CELL11, CELL12, CELL21, and CELL22 is a hybrid electromechanical configuration bit cell such as cell 800 shown in FIG. 8. Each cell has a read output node 809 which furnishes a control signal for a programmable bus 210. Besides the programmable interconnect blocks, there may be other circuitry not part of the array (such as logic blocks between the two configuration bit columns) that is not shown for diagram simplicity. Input address for the write and erase operations are furnished to X decoder and buffers 1002. The decoder 1002 receive the address, clock (CLK), and enable signals and provides output on shared word lines 1004 (WLA1), 1005 (WLA2), 1006 (WLB1), and 1007 (WLB2). The word lines 1004 and 1006 and select CELL11 and CELL12, while the word lines 1005 and 1007 select CELL21 and CELL22. Y control blocks 1003 receive the input data, control, and clock (CLK). The blocks 1003 furnish output to the shared bit lines 1010 (BL1), and 1011 (BL2). The bit line 1010 is shared by CELL11 and CELL21, while the bit line 1011 is shared by CELL12 and CELL22.

Memory cell writes are accomplished in a manner outlined in FIG. 9 and expanded on here. The same three phase configuration bit programming is used for this array as for the array of FIG. 6. First, all configuration bit cells are erased by bringing all word lines 1004, 1005, 1006, and 1007 to voltage GROUND, the global Z conductor 1014 to voltage level VDD, and bit lines 1010 and 1011 to voltage level RELEASE. This erase procedure puts all cells in the release mode and sets all switches in the array to the open state. Next, the entire array is written row by row in the write phase, each row being written in two steps. This is accomplished by first driving the wordline WBA associated with the row being written to voltage level PROGRAM, driving all other wordlines to voltage level GROUND (including the wordline WLB associated with the row being written), driving global Z conductor 1014 to VDD, and driving the bit lines in accordance with the values to be written. The bit lines are set to INHIBIT for cells in which the switch 802 is to be kept open and set to GROUND for cells in which the switch 802 is to be closed. Next, the switches 803 are selectively closed by driving the wordline WLB associated with the rows being written to voltage level PROGRAM, driving all other wordlines to voltage level GROUND (including the wordline WLA associated with the row being written), driving global Z conductor 1014 to VDD, and driving the bitlines in accordance with the values to be written. The bit lines are set to INHIBIT for cells in which the switch 803 is to be kept open and set to GROUND for cells in which the switch 803 is to be closed.

To illustrate, to write Cell 11 to ZERO and Cell 12 to ONE in the first row of the configuration bit array (after first erasing the memory in the manner described), the first row cells Cell 11 and Cell 12 are written to state values ZERO and ONE, respectively. To do this, the global Z conductor 1014 is driven to VDD, wordline 1004 to PROGRAM, wordline 1006 to GROUND, wordline 1005 to GROUND, wordline 1007 to GROUND, bit line 1010 to INHIBIT, and bit line 1011 to GROUND. This step accomplishes the closing of switch 802 in Cell 12. Next, the global Z conductor 1014 is driven to VDD, wordline 1004 to GROUND, wordline 1006 to PROGRAM, wordline 1005 to GROUND, wordline 1007 to GROUND, bit line 1010 to GROUND, and bit line 1011 to INHIBIT. This closes switch 803 in Cell 11. It should be noted that the voltage value of INHIBIT is used to selectively close some of the switches and leave open some of the others.

Next, other rows are written is a similar fashion. Finally, after writing the entire memory array (which could be any size) row by row to the correct state for the configuration bits, the word lines are set appropriately for read. The global Z conductor 1014 is set to GROUND, bit line 1010 to GROUND, bit line 1011 to GROUND, wordline 1004 to VDD, wordline 1006 to GROUND, wordline 1005 to VDD, and wordline 1007 to GROUND. As illustrated at the cell level, each cell drives its stored state onto the dedicated read lines to be used by the programmable buses.

Figure 11:
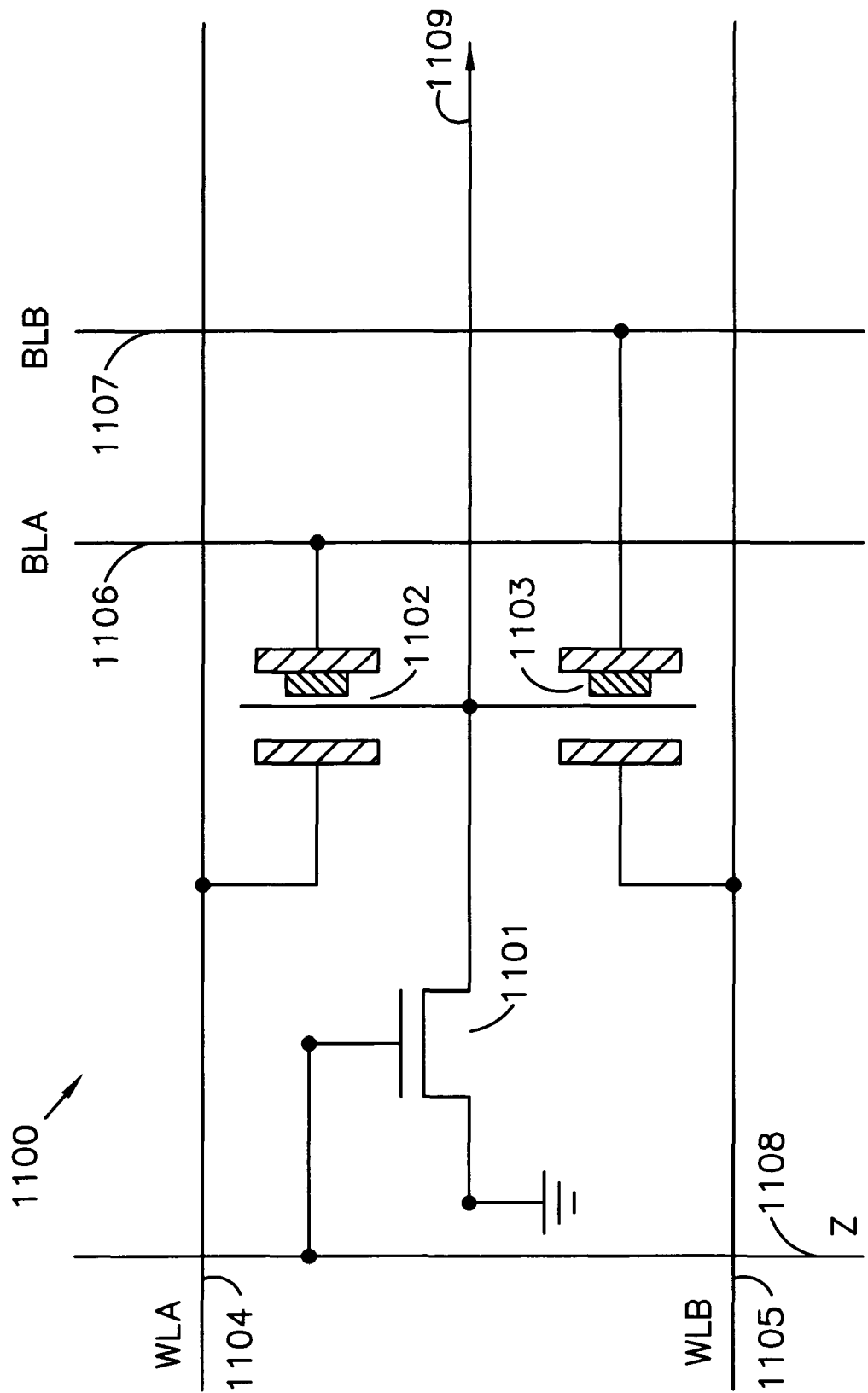
FIG. 11 illustrates an alternate embodiment of a hybrid technology configuration bit cell in accordance with the present invention.
Figure 13:
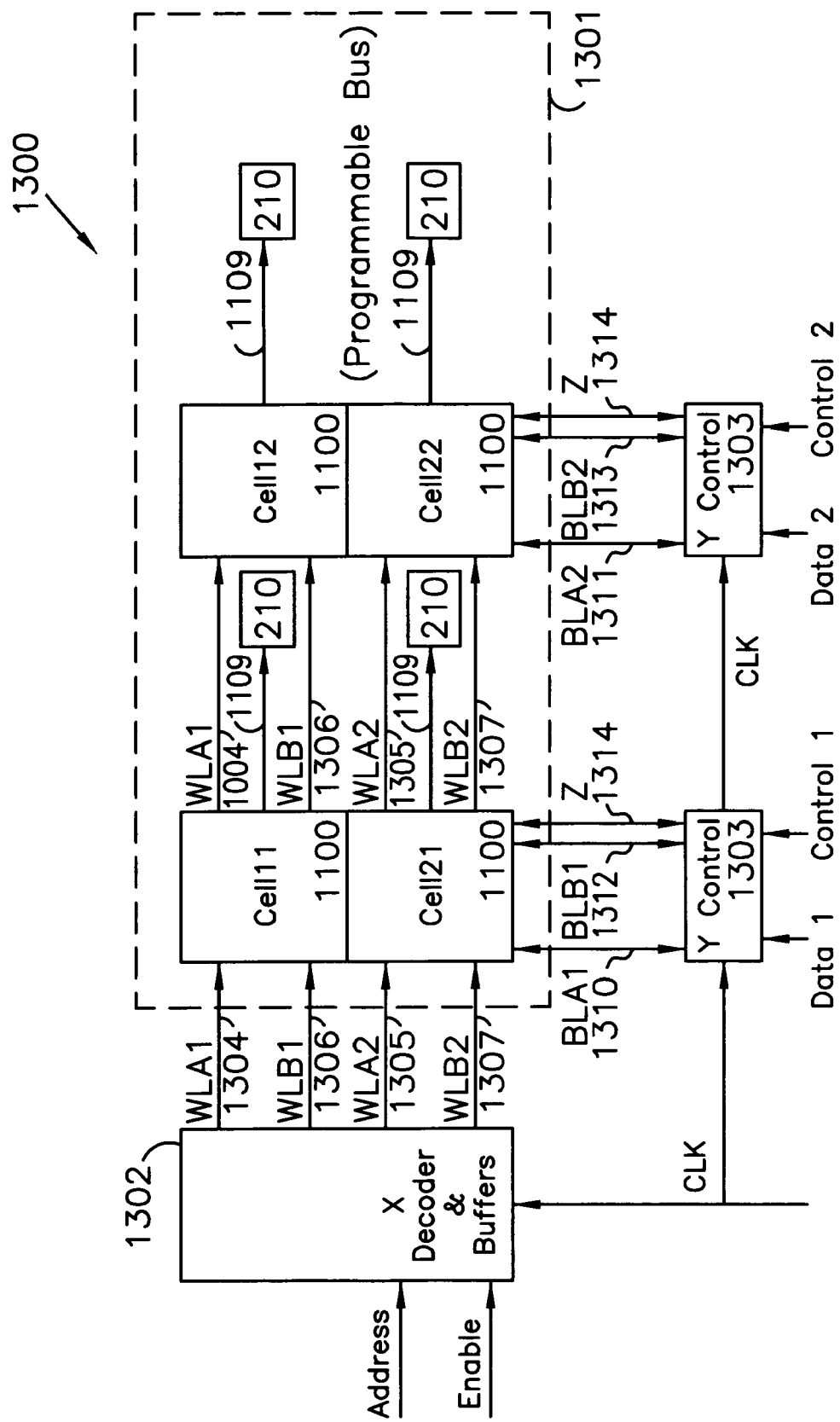
FIG. 13 illustrates an embodiment of a hybrid technology configuration bit array using the configuration bit cell of FIG. 11.

FIG. 11 introduces another alternate configuration bit cell similar to that of FIG. 8. The values used in the procedure to erase, write, and set for read this cell are outlined in FIG. 12. An array level block diagram utilizing the cell of FIG. 11 is shown in FIG. 13. The configuration bit arrays of FIGS. 10 and 13 and the configuration bit cells of FIGS. 8 and 11 differ from one another in the introduction of a second bit line. Specific added bit lines are labeled BLB1 (1312) and BLB2 (1313) at the array level in FIG. 13. The additional bit line allows the writing of each row in one step instead of the two steps required for the array of FIG. 10. The cost comes at the addition of another bit line and associated driver circuitry. To write Cell 11 to ZERO and Cell 12 to ONE in the first row in a single step (after first erasing the memory by opening all switches in a manner similar to that described for the array of FIG. 10), the global Z conductor 1314) is driven to VDD, wordline 1304 to PROGRAM, wordline 1306 to PROGRAM, wordline 1305 to GROUND, wordline 1307 to GROUND, bit line 1310 to INHIBIT, bit line 1312 to GROUND, bit line 1311 to GROUND, and bit line 1313 to INHIBIT. This step closes switch 1102 in Cell 12 and switch 1103 in Cell 11. Thus the addition of the extra bit line (column BLB) allows writing the configuration bit contents for this row is accomplished in a single step rather than the two steps required for writing the array of FIG. 10. The phase of setting for read is similar to that for the array in FIG. 10.

A configuration bit memory cell 1100 includes a first carbon nanoscopic switching three-terminal device 1102 having a first terminal, a second terminal, and a third terminal, the first terminal is connected to an attractor plate, the second terminal is connected to a release plate, a third terminal is connected commonly to a first movable nanoscopic element and an output node. A second carbon nanoscopic switching three-terminal device 1103 includes a first terminal, a second terminal, and a third terminal, where the first terminal is connected to an attractor plate, the second terminal is connected to a release plate, a third terminal is connected commonly to a second movable nanoscopic element and the output node. A transistor 1101 has a first terminal, a second terminal, and a third terminal connected commonly to the first movable nanoscopic element of the first carbon nanoscopic switching device 1102, the second movable nanoscopic element of the second carbon nanoscopic switching device 1103, the third terminal of the first carbon nanoscopic switching device 1102, the third terminal of the second carbon nanoscopic switching device 1103, and the output node. Connection circuitry completes a first conductive path through one of the carbon nanoscopic switching devices and opens a second conductive path through the other of the carbon nanoscopic switching devices. The connection circuitry includes a first wordline 1104 extending in a first direction and connected to the first terminal of the first carbon nanoscopic switching device 1102. A second wordline 1105 extends in a first direction and parallel to the first wordline 1104 in which the second wordline 1105 connected to the first terminal of the second carbon nanoscopic switching device. A first bitline 1106 extends in a second direction such that the first bit line is connected to the second terminal of the first carbon nanoscopic switching device 1102. A second bitline 1107 extends in a second direction such that the second bit line is connected to the second terminal of the second carbon nanoscopic switching device 1103.

FIG. 13 illustrates how a slight variation to the cell (the addition of an extra bit line) can produce a trade off between total array write speed and array complexity. There are a number of other possible cell variations that can produce such trade offs that are within the spirit of the invention. Similar variations in the sequencing scheme and at the array level also exist which provide design trade offs.

For example, the cell 1100 of FIG. 11 and the array 1300 of FIG. 13 could be written by a new scheme outlined in FIG. 14 rather than the scheme outlined in FIG. 12. To write or initialize the configuration bit array 1300 in FIG. 13 by this process, a variation on the three step scheme outlined earlier is utilized. To use the alternate methodology to write state ZERO to Cell 11, state ONE to Cell 12, state ZERO to Cell 21, and state ZERO to Cell 22 in the configuration bit array in FIG. 13, all word lines 1304, 1305, 1306, and 1307 are set to voltage PROGRAM, the global Z conductor 1314 is set to VDD, and all bit lines 1310, 1311, 1312, and 1313 are set to GROUND. This has the effect of closing all switches 1102 and 1103 in the array (Cell 11, Cell 12, Cell 21, and Cell 22).

Next, exactly one of the switches 1102 or 1103 in each of the array cells is opened by setting wordline 1304 to GROUND, wordline 1306 to GROUND, wordline 1305 to VDD, wordline 1307 to VDD, the global Z conductor to GROUND, bit line 1310 to RELEASE, bit line 1312 to GROUND, bit line 1311 to GROUND, and bit line 1313 to RELEASE. This has the effect of releasing switch 1102 in Cell 11 and switch 1103 in Cell 12. Notice that no switches (neither Cell 21 nor Cell 22) in row two are released because the word lines associated with this row (1305 and 1307) are driven to VDD and the conduction through the switches closed by the first stage is utilized to drive the node 1109 in these cells to VDD. Hence, the voltage seen between the terminals 404 and 401 of a cell is less than RELEASE by the voltage amount VDD. Thus, no release of these switches occurs since VDD is applied to the 401 layers. In this case, there is simply not enough voltage between the plates 404 and layer 401 to accomplish release so the switches are used in their normal operating regions.

Next, the second row of the array is programmed by driving wordline 1304 to VDD, wordline 1306 to VDD, wordline 1305 to GROUND, wordline 1307 to GROUND, the global Z conductor 1314 to GROUND, bit line 1310 to RELEASE, bit line 1312 to GROUND, bit line 1311 to RELEASE, and bit line 1313 to GROUND. This has the effect of releasing switch 1102 in cells Cell 21 and Cell 22. Once again, Cell 11 and Cell 12 of the first row are not affected since the word lines 1304 and 1306 associated with this row are driven to VDD and the conduction through a closed one of the switches is utilized to drive node 1109 in these cells to VDD. Consequently, the voltage between the plates 404 and layer 401 for the switches in Cell 11 and Cell 12 is less RELEASE by the amount VDD so no change occurs. The array has now been programmed to the state values desired. The array is then set for read by driving wordline 1304 to VDD, wordline 1305 to VDD, wordline 1306 to GROUND, wordline 1307 to GROUND, the global Z conductor 1314 to GROUND, bit line 1310 to GROUND, bit line 1311 to GROUND, bit line 1312 to GROUND, and bit line 1313 to GROUND. This setting allows the cell state to be driven on the dedicated read nodes 1109 in a manner identical to the previous scheme.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A configuration bit memory cell comprising:
    a first carbon nanoscopic switching three-terminal device having a first terminal, a second terminal, and a third terminal, the first terminal connected to an attractor plate, the second terminal connected to a release plate, a third terminal connected commonly to a first movable nanoscopic element and an output node;
    a second carbon nanoscopic switching three-terminal device having a first terminal, a second terminal, and a third terminal, the first terminal connected to an attractor plate, the second terminal connected to a release plate, a third terminal connected commonly to a second movable nanoscopic element and the output node;
    a transistor having a first terminal, a second terminal, and a third terminal connected commonly to the first movable nanoscopic element of the first carbon nanoscopic switching device, the second movable nanoscopic element of the second carbon nanoscopic switching device, the third terminal of the first carbon nanoscopic switching three-terminal device, the third terminal of the second carbon nanoscopic switching three-terminal device, and the output node; and
    connection circuitry to complete a first conductive path through one of the carbon nanoscopic switching three-terminal devices and opens a second the conductive path through the other of the carbon nanoscopic switching three-terminal devices, the connection circuitry including
    a first wordline extending in a first direction and connected to the first terminal of the first carbon nanoscopic switching three-terminal device;
    a second wordline extending in a first direction and parallel to the first wordline, the second wordline connected to the first terminal of the second carbon nanoscopic switching three-terminal device; and
    a first bitline extending in a second direction, the first bit line connected to both the second terminal of the first carbon nanoscopic switching three-terminal device and the second terminal of the second carbon nanoscopic switching three-terminal device.

2. The configuration bit memory cell as recited in claim 1, wherein
    the connection circuitry includes circuitry capable of switching potentials to the first and second movable nanoscopic elements, the first and second attractor plates, and the first and second release plates of the first and second carbon nanoscopic switching three-terminal devices to generate electrostatic fields to selectively place one of the carbon nanoscopic switching three-terminal devices in a closed state and the other of the devices in the open state.

3. The configuration bit memory cell as recited in claim 2, wherein
    the connection circuitry capable of switching potentials includes circuitry by which electrostatic fields may be generated between the first movable nanoscopic element and the first attractor plate and capable of moving the first movable nanoscopic element into contact with the first attractor plate in the first carbon nanoscopic switching three-terminal device; and
    between the first movable nanoscopic element and the first release plate capable of moving the first movable nanoscopic element from contact with the first attractor plate in the first carbon nanoscopic switching three-terminal device.

4. The configuration bit memory cell as recited in claim 1, wherein the first and second movable nanoscopic elements are joined to the same potential source.

5. The configuration bit memory cell as recited in claim 1, wherein the first and second release plates are joined to the same potential source.

6. The configuration bit memory cell as recited in claim 1, wherein the transistor capable of switching potentials includes a field effect transistor for providing a potential to the first and second attractor plates of both nanoscopic switching three-terminal devices.

7. The configuration bit memory cell as recited in claim 1, further comprising a first source potential and a second source potential, the first source potential and the second source potential having different voltage values, the first terminal of the transistor connected to the first source potential, and the second terminal of the transistor connected to the second source potential.

8. The configuration bit memory cell as recited in claim 7, wherein the second source potential comprises a conductor line extending in a second direction.

9. The configuration bit memory cell as recited in claim 1, wherein the first carbon nanoscopic switching three-terminal device is programmed with a logic state of zero, and the second carbon nanoscopic switching three-terminal device is programmed with a logic state of one.

10. The configuration bit memory cell as recited in claim 1, wherein the first carbon nanoscopic switching three-terminal device is programmed with a logic state one, and the second carbon nanoscopic switching three-terminal device is programmed with a logic state zero.

11. A configuration bit memory cell comprising:
a first carbon nanoscopic switching three-terminal device having a first terminal, a second terminal, and a third terminal, the first terminal connected to an attractor plate, the second terminal connected to a release plate, a third terminal connected commonly to a first movable nanoscopic element and an output node;
a second carbon nanoscopic switching three-terminal device having a first terminal connected to a second terminal, and a third terminal, the first terminal connected to an attractor plate, the second terminal connected to a release plate, a third terminal connected commonly to a second movable nanoscopic element and the output node;
a transistor having a first terminal, a second terminal, and a third terminal connected commonly to the first movable nanoscopic element of the first carbon nanoscopic switching three-terminal device, the second movable nanoscopic element of the second carbon nanoscopic switching three-terminal device, the third terminal of the first carbon nanoscopic switching three-terminal device, the third terminal of the second carbon nanoscopic switching three-terminal device, and the output node; and
connection circuitry to complete a first conductive path through one of the carbon nanoscopic switching three-terminal devices and opens a second the conductive path through the other of the carbon nanoscopic switching three-terminal devices, the connection circuitry including
a first wordline extending in a first direction and connected to the first terminal of the first carbon nanoscopic switching three-terminal device;
a second wordline extending in a first direction and parallel to the first wordline, the second wordline connected to the first terminal of the second carbon nanoscopic switching three-terminal device;
a first bitline extending in a second direction, the first bit line connected to the second terminal of the first carbon nanoscopic switching three-terminal device; and
a second bitline extending in a second direction, the second bit line connected to the second terminal of the second carbon nanoscopic switching three-terminal device.

12. The configuration bit memory cell as recited in claim 11, wherein
the connection circuitry includes circuitry capable of switching potentials to the first and second movable nanoscopic elements, the first and second attractor plates, and the first and second release plates of the first and second carbon nanoscopic switching three-terminal devices to generate electrostatic fields to selectively place one of the carbon nanoscopic switching three-terminal devices in a closed state and the other of the devices in the open state.

13. The configuration bit memory cell as recited in claim 12, wherein
the connection circuitry capable of switching potentials includes circuitry by which electrostatic fields may be generated between the first movable nanoscopic element and the first attractor plate and capable of moving the first movable nanoscopic element into contact with the first attractor plate in the first carbon nanoscopic switching three-terminal device; and
between the first movable nanoscopic element and the first release plate capable of moving the first movable nanoscopic element from contact with the first attractor plate in the first carbon nanoscopic switching three-terminal device.

14. The configuration bit memory cell as recited in claim 11, wherein the first and second movable nanoscopic elements are joined to the same potential source.

15. The configuration bit memory cell as recited in claim 11, wherein the first and second release plates are joined to different potential sources.

16. The configuration bit memory cell as recited in claim 11, wherein the transistor capable of switching potentials includes a field effect transistor for providing a potential to the first and second attractor plates of both nanoscopic switching three-terminal devices.

17. The configuration bit memory cell as recited in claim 11, further comprising a first source potential and a second source potential, the first source potential and the second source potential having different voltage values, the first terminal of the transistor connected to the first source potential, and the second terminal of the transistor connected to the second source potential.

18. The configuration bit memory cell as recited in claim 17, wherein the second source potential comprises a conductor line extending in a second direction.

19. The configuration bit memory cell as recited in claim 11, wherein the first carbon nanoscopic switching three-terminal device is programmed with a logic state of zero, and the second carbon nanoscopic switching three-terminal device is programmed with a logic state of one.

20. The configuration bit memory cell as recited in claim 11, wherein the first carbon nanoscopic switching three-terminal device is programmed with a logic state one, and the second carbon nanoscopic switching three-terminal device is programmed with a logic state zero.

* * * * *

UNITED STATES PATENT AND TRADEMARK OFFICE
CERTIFICATE OF CORRECTION

PATENT NO. : 7,940,557 B1
APPLICATION NO. : 12/974737
DATED : December 21, 2010
INVENTOR(S) : David Richard Trossen and Malcolm John Wing It is certified that error appears in the above-identified patent and that said Letters Patent is hereby corrected as shown below:

In Column 7, line 59, please delete "in" and insert therein --is--.

In Column 14, line 6, please delete "the".

In Column 15, line 38, please delete "the".

Signed and Sealed this
Twenty-sixth Day of July, 2011

David J. Kappos
*Director of the United States Patent and Trademark Office*